United States Patent [19]

Takagi

[11] Patent Number: 5,643,839

[45] Date of Patent: Jul. 1, 1997

[54] METHOD FOR PRODUCING SEMICONDUCTOR DEVICE

[75] Inventor: Mikio Takagi, Kanagawa, Japan

[73] Assignee: F.T.L. Co., Ltd., Kanagawa, Japan

[21] Appl. No.: 377,703

[22] Filed: Jan. 25, 1995

Related U.S. Application Data

[62] Division of Ser. No. 224,866, Apr. 8, 1994, Pat. No. 5,407,485.

[30] Foreign Application Priority Data

Apr. 9, 1993 [JP] Japan ........................................ 5-83464

[51] Int. Cl.⁶ ............................................. H01L 21/324
[52] U.S. Cl. ............................................. 437/247
[58] Field of Search ............................... 437/247, 190, 437/200, 191, 245; 148/DIG. 3, DIG. 4; 29/25.01, 25.02; 118/724, 719, 730, 725; 156/345; 204/298.09

[56] References Cited

U.S. PATENT DOCUMENTS

| | | | |
|---|---|---|---|
| 4,857,689 | 8/1989 | Lee | 219/10.71 |
| 4,950,870 | 8/1990 | Mitsuhashi et al. | 418/725 |
| 5,043,300 | 8/1991 | Nulman | 437/200 |
| 5,232,506 | 8/1993 | Kawase | 118/719 |
| 5,252,807 | 10/1993 | Chizinsky | 219/390 |
| 5,273,585 | 12/1993 | Shoga | 118/719 |
| 5,288,326 | 2/1994 | Maeda | 118/719 |
| 5,359,693 | 10/1994 | Nenyei | 392/418 |
| 5,387,557 | 2/1995 | Takagi | 437/247 |
| 5,388,944 | 2/1995 | Takanabe et al. | 418/719 |
| 5,504,043 | 4/1996 | Ngan et al. | 437/247 |

FOREIGN PATENT DOCUMENTS

0538874A1  4/1993  Japan ........................................ 437/247

OTHER PUBLICATIONS

Roozeboom, Fred; Rapid Thermal Processing Systems: A Review with Emphasis on Temperature Control; Jul. 17, 1990.

Singh, R.; School of Electrical Engineering and Computer Science; University of Oklahoma; Rapid Isothermal Processing; Dec. 1, 1987.

Primary Examiner—John Niebling
Assistant Examiner—S. Mulpuri
Attorney, Agent, or Firm—Armstrong, Westerman, Hattori, McLeland & Naughton

[57] ABSTRACT

In a rapid thermal processing (RTP) of a large-diameter wafer, a wafer is heat treated by an upper high-temperature furnace and a lower low-temperature furnace, which are separated from and can be brought into close contact with one another by a relative vertical position adjusting means. The upper high-temperature furnace has an open bottom which is shut by an openable, heat insulating shutter. Height of the apparatus as a whole can be shortened.

1 Claim, 3 Drawing Sheets

METHOD FOR PRODUCING SEMICONDUCTOR DEVICE

This is a division of application Ser. No. 08/224,866 filed Apr. 8, 1994 now U.S. Pat. No. 5,407,485.

BACKGROUND OF INVENTION

1. Field of Invention

The present invention relates to a production apparatus of a semiconductor device, more specifically to a production apparatus which is appropriate for the rapid thermal processing (RTP) of large-diameter wafers, particularly 8 to 12 inch wafers. The present invention also relates to a production method of a semiconductor device by RTP.

2. Description of Related Art

At present, a variety of RTP apparatuses, the heating source of which are lamp, is commercially available. However, the heat mass of such lamp is small, and, although a wafer can be heated and cooled at a high rate by this method, the temperature uniformity is inferior to that attained by the other heating means. The lamp heating source, therefore, involves a problem in that it is liable to formation of slip lines, particularly on a large-diameter wafer.

U.S. Pat. No. 4,857,689 issued to Lee notes that RTP by means of a lamp has a drawback in temperature distribution on the wafer surface and hence cannot attain uniform and reproducible processing results. An RTP apparatus proposed in U.S. Pat. No. 4,857,689 comprises a longitudinal processing tube made of quartz and having a closed top, a heater provided on the upper portion of the processing tube, a wafer-supporting means capable of vertically displacing the wafer in the processing tube, and a micro-computer for controlling the wafer-displacing speed and wafer-temperature depending upon the wafer position.

Japanese Unexamined Patent Publication No. 60-67,672 proposes a heating apparatus which comprises a high-temperature heating region, a low-temperature heating region, and a cooling body interposed between these two regions. A steep temperature gradient between the two regions can be provided by the cooling body. The high- and low-temperature heating regions are assumed to be set at 850° and 750° C., respectively, and the temperature gradient attained is 5° C./mm.

It is not easy by means of the heating apparatuses of the prior art to uniformly heat a large-diameter wafer to a desired temperature, to rapidly elevate or lower the temperature, and to keep the height of the apparatus as short as possible. For example, in the above mentioned U.S. Pat. No. , since the temperature of the lower portion of the furnace, where a heater is not arranged, is set at an extremely low level, it is difficult for chemical vapor deposition (CVD) to be carried out in the lower portion.

Along with an enhanced integration, future semiconductor devices call for annealing at temperature as high as 1100° C. and in as short a time as possible. Since heat transmission by radiation prevails at a temperature above 900° C., an intermediate cooling body as is proposed in Japanese Unexamined Patent Publication No. 60-67,672 cannot attain a steep temperature gradient. For example, in the case where the temperature difference is 350° C. (high temperature—1050° C., low temperature—700° C.), the intermediate region between the high- and low-temperature regions becomes as long as 350 mm or more, so that the overall length of the heating apparatus becomes very long.

SUMMARY OF THE INVENTION

It is, therefore, an object of the present invention to provide a production apparatus of a semiconductor device, which enables a large-diameter wafer to be uniformly heated to a desired temperature, to rapidly elevate or lower the temperature, and to keep the height of the apparatus as short as possible.

It is another object of the present invention to provide a production method of a semiconductor device by means of RTP of a large-diameter wafer.

In accordance with the present invention, there is provided a production apparatus of a semiconductor device comprising:

an upper high-temperature furnace having an open bottom;

a lower low-temperature furnace having an open top and being arranged essentially coaxially with respect to the upper high-temperature furnace;

a processing tube extending through the lower low-temperature furnace and having a closed top portion protruding through the open top of the lower low-temperature furnace;

a wafer-supporting means, for supporting and vertically displacing the wafer(s) in the processing tube; and, an openable, heat-insulating shutter for shutting the open bottom of the upper high-temperature furnace; and, a means for adjusting a relative vertical position of the upper high-temperature furnace and the lower low-temperature furnace within a distance range between the first distance, where the upper high-temperature furnace and the lower low-temperature furnace abut with one another to form an integral furnace, and the second distance, where the upper high-temperature furnace and the lower low-temperature furnace are separated such that the openable, heat-insulating shutter is interposed in a space between the upper high-temperature furnace and the lower low-temperature furnace.

In the present invention, the upper high-temperature furnace and the lower low-temperature furnace are separately provided and distant from one another. Soaking in the respective furnaces can be carried out at a desired temperature. The upper high-temperature furnace, whose bottom has been opened by removing the openable, heat-insulating shutter, and the lower low-temperature furnace can be brought into close contact with one another. This feature enables a high temperature to be provided at a high speed and the furnace height to be kept short as is described more in detail hereinbelow.

In accordance with a preferred embodiment of the present invention, the upper high-temperature furnace consists of an electric heating furnace, and the lower low-temperature furnace consists of another electric heating furnace. Since the electric heating furnace has excellent thermal stability, and, further, a vertical furnace with electric heating system attains excellent temperature distribution across the transverse cross section thereof, which has been proved by experiments, a large-sized wafer having a diameter of 8 inches or more can be advantageously subjected to rapid heat annealing without incurring slip lines.

According to the present invention, the openable, heat-insulating shutter may comprise a cooling plate which is provided, on the lower and upper surfaces, with a gold plated layer. The gold plated layer reflects the heat of the upper high-temperature furnace into its furnace space so that the temperature can be further enhanced. The gold plated layer may be covered with a quartz cover.

According to another embodiment of the present invention, a reflective ring is secured on the bottom of the upper high-temperature furnace and has an aperture capable of passing the processing tube. The processing tube can therefore be introduced into the upper high-temperature furnace through the aperture of the reflective ring, when the high-temperature heat treatment is to be carried out. The reflective ring can reflect radiant heat from the upper high-temperature furnace into the furnace interior, and, therefore, a high temperature can be attained notwithstanding removal of the shutter.

In accordance with the present invention, there is provided a method for producing a semiconductor device, comprising the steps of:

electric-resistance heating a first furnace to a first temperature, while essentially preventing leakage of radiant heat but allowing escape of gas heated and expanded by an electric resistance-heater outside the first furnace;

electric-resistance heating a second furnace to a second temperature lower than the first temperature;

subjecting a wafer(s) to a first heat treatment in a processing tube located in the second furnace which is heated to the second temperature;

after completion of the first heat treatment, directly transmitting the radiant heat of the first furnace in a downward direction into the second furnace which has been heated to the first temperature;

maintaining the wafer(s) in the second furnace until temperature of the second furnace arrives at a temperature almost half of the first and second temperatures; and, subsequently, subjecting the wafer(s) to a second heat treatment in the second furnace or first furnace, while the radiant heat of the first furnace is directly transmitted from the first furnace into the second furnace.

The first furnace has an open bottom, which is shut by an openable, heat-insulating shutter during the first heat treatment, thereby preventing leakage of the radiant heat of the first furnace but allowing thermally expanded gas to leak through a minute clearance between the upper high-temperature furnace and the shutter. When the second heat treatment is to be carried out, the openable bottom is opened by means of horizontally displacing the openable, heat-insulating shutter and then the first and second furnaces are brought into contact with one another by vertically displacing the furnaces relative to one another. Then, the radiant heat of the first furnace is transmitted directly into the second furnace.

Preferably, the radiant heat of the first furnace is partly reflected into the first furnace so as to enhance the first temperature and thus attain a steep temperature gradient. The above-mentioned partial reflection of radiant heat is preferably realized by the reflectivity of gold or the like which is applied on the reflective ring described above.

According to the method of the present invention, the first and second furnaces are preliminarily heated to the desired temperatures, i.e., the first and second temperatures. The processing tube is heated to the second temperature lower than the first temperature. The temperature difference between the first and second temperatures may be 250° C. or more, or 300° C. or more. A large-diameter wafer(s) can therefore be thoroughly soak-heated in the second furnace when the radiant heat of the first furnace is directly transmitted to the second furnace in a downward direction.

When the two furnaces are communicated via the open bottom and open top of the first and second furnaces, respectively, the radiant heat of the first or upper high-temperature furnace is directly transmitted into the second or lower low-temperature furnace, thereby rapidly elevating the temperature of the latter furnace.

A wafer(s) is held in the second furnace until its temperature rises up to a level almost half of the first and second temperatures. Then, a wafer(s) can be subjected to the second heat treatment by maintaining the wafer(s) at essentially the same position as in the first heat treatment. This method is appropriate in a case where the temperature of second heat treatment is somewhat high, for example, 900° C. The heat treatment carried out in the second furnace may be reflowing of a B-PSG film which has been formed at approximately 850° C., or CVD of silicon dioxide film with conventional monosilane.

A wafer(s) can be elevated into the first or high-temperature furnace so as to subject the wafer(s) to the second heat treatment at the first temperature. This method is preferred when the temperature of the second heat-treatment is high, for example 1100° C.

The present invention is described with reference to several specific embodiments.

In the present invention, electric furnaces having excellent temperature-stability are utilized so as to realize RTP and to provide a process which is adapted to semiconductor processing. For example, in a typical case of vertical RTP furnace, the low or second temperature is for stabilizing the wafer's temperature at a temperature lower than the first temperature, and the high or first temperature is for annealing. In the stabilizing heat-treatment, the wafer(s) is held at the second temperature only for time period not cause change of a threshold voltage (Vth) of a transistor. Typically, a single wafer is introduced from below and is first stabilized at low temperature or second temperature.

The growth of thin film at low temperature may be growth at approximately 700° C. in terms of furnace temperature. The growth of thin film includes growth of silicon dioxide with organic silane or disilane and growth of B-PSG (boron phosphosilicate glass) with tetraethoxy silane (TEOS), tetramethoxy phosphorus (TMOP) or tetramethoxy silicate boron (TMSB).

Basically, a single wafer is heat-treated by the method of the present invention. However, a plurality of wafers, particularly from two to three wafers, can be heat-treated by the method of the present invention, provided that the wafers undergo the same heat treatment. A wafer holder need not be special one but may be made of ordinary quartz. The wafer holder should be rotated in the usual way so as to attain uniform temperature distribution on the wafer surface.

The temperature-stabilizing followed by rapid thermal annealing is one of the most pertinent steps in semiconductor-device processing, to which the inventive method is applied.

After the second heat-treatment, the wafer(s) can be again maintained in the second furnace, which is separated from the first furnace, for a time sufficient to stabilize the wafer's temperature at the second-furnace temperature.

The following methods provide several preferred embodiments.

| No | The first heat treatment in the second furnace (low temp.) | The second heat treatment in the first furnace (high temp.) |
| --- | --- | --- |
| 1 | Temperature-stabilization of B-PSG | RTP |
| 2 | Sintering of sputtered Ti to convert to TiSi$_2$ | RTP in N$_2$ atmosphere |
| 3 | Sintering of sputtered Ti to convert to TiSi$_2$ | Nitriding in NH$_3$ to convert TiSi$_2$ to TiN |

The above described methods can be carried out at various stages of the semiconductor-device processing. A typical stage is after delineating a polysilicon layer which has been formed on the surface insulating film of a silicon substrate.

The present invention is hereinafter described with reference to embodiments illustrated in the drawings.

DETAILED DESCRIPTION OF THE PREFERRED EMBODIMENTS

Figure 1:
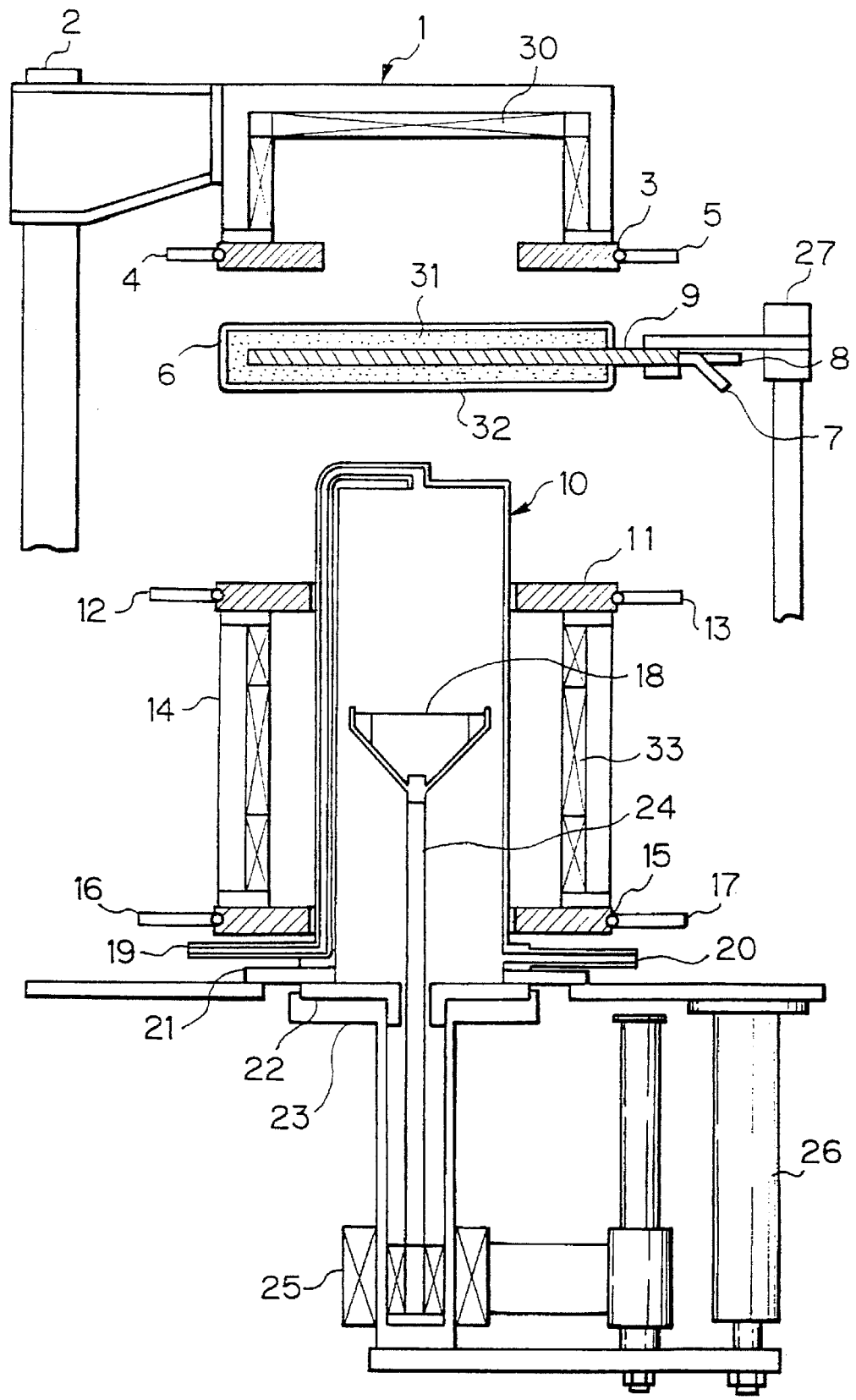
FIG. 1 shows an embodiment of a production apparatus of a semiconductor device according to the present invention.
Figure 2:
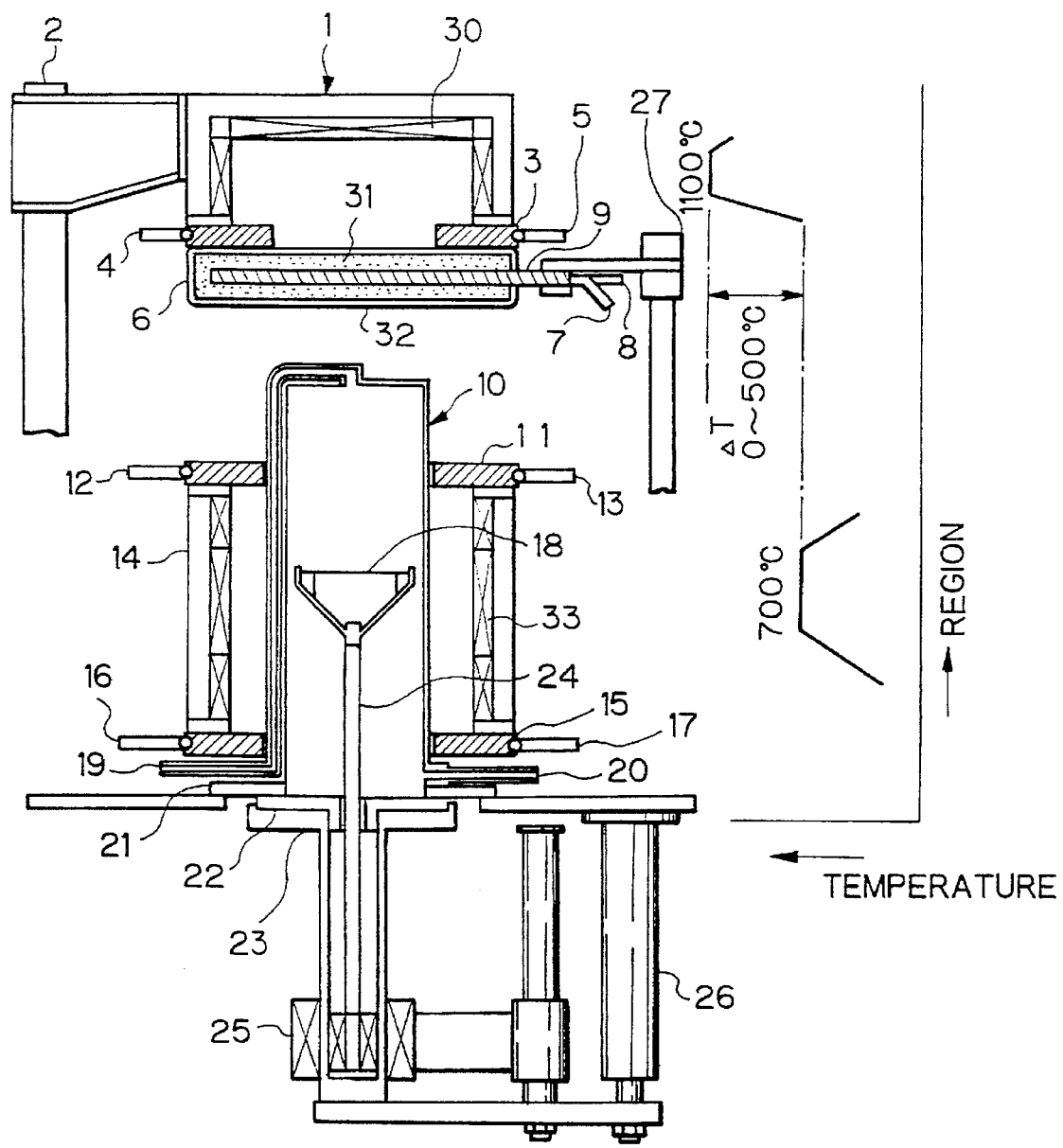
FIG. 2 illustrates a production method of a semiconductor device according to the present invention, particularly the heating to the first and second temperatures and the first heat treatment.
Figure 3:
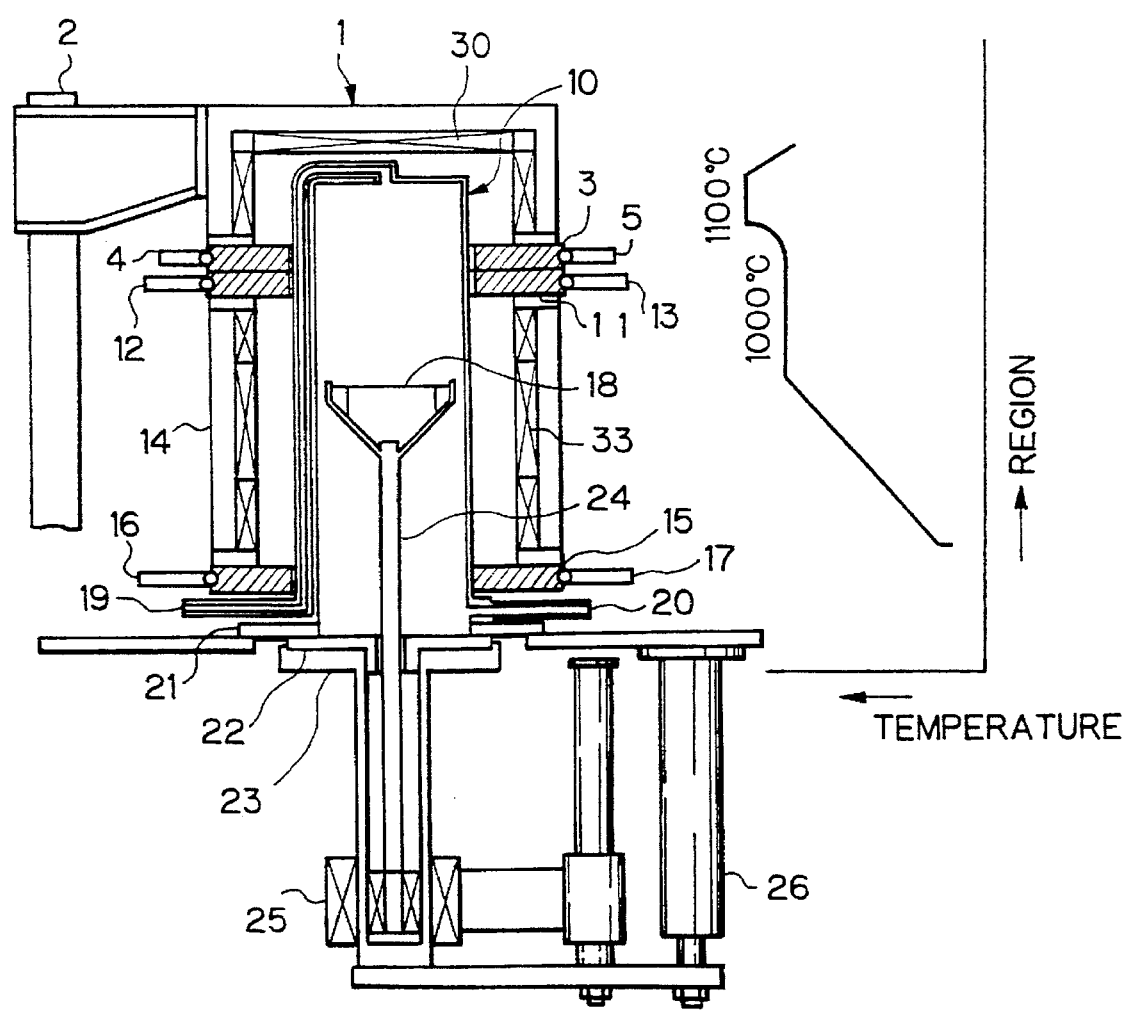
FIG. 3 illustrates a production method of a semiconductor device according to the present invention, particularly the second heat treatment while transmitting directly and downward the radiant heat from the first to the second furnace.

Referring to FIGS. 1 through 3, 1 is an upper high-temperature furnace, 6 is an openable, heat-insulating shutter, 10 is a processing tube made of quartz, 14 is a lower, low-temperature furnace, 18 is a laterally held wafer, and 24 is a wafer holder.

The upper high-temperature furnace 1 comprises a tubular body, whose top is closed, and is vertically driven upward and downward relative to the lower high-temperature furnace 14 by a lifting system 2. The electric-resistance heater 30 is secured on the inner, side and top walls and heats the furnace 1 to the desired temperature. Gold reflective layer (not shown) may be applied on the furnace wall between it and the electric re-resistance heater 30. The bottom of the upper high-temperature furnace is opened such that the processing tube 10 passes through the aperture. The reflective ring 3 is secured to the bottom of the upper high-temperature furnace 1, such that the ring's inner edge protrudes radially inward. The radiant heat from the electric-resistance heater 30 is therefore reflected by the reflective ring 3 at its entire circumference, and the reflected radiant heat elevates the temperature of the furnace interior. The upper surface of the reflective ring 3 is preferably gold-plated to increase its reflectivity. Inlet 4 and outlet 5 for cooling water are attached on the reflective ring 3.

A shutter 6 comprises a heat-reflective plate 9, on which both surfaces, gold plating 31 is applied. The gold plating 31 is covered in turn with a quartz cover 32. Cooling water is admitted into the cavity (not shown) of the heat-reflective plate 9 via the inlet 7 and is withdrawn via the outlet 8.

The heat-reflective plate 9 cover with the gold plating 31 and the quartz cover 32 is carried by a swivelling mechanism 27 which is driven vertically and drives the shutter 6 in a horizontal plane. The openable, heat-insulating shutter insulates radiant heat but is not so rigidly fixed to the upper high-temperature furnace 1 as to prevent expanded gas, e.g., air, from leaking outside the furnace 1. Although the shutter-driving mechanism 27 shown in FIG. 1 swivels, it is not restricted to swiveling but also may be linearly reciprocating. In addition, a heat-resistant cover may be formed on the reflective ring 3 except for the lower surface.

The processing tube 10 is a vertical tube which is appropriate for subjecting the wafer 18 to CVD, diffusion, annealing and other various treatments of semiconductor processing. Such treatments can be carried out under any condition of normal pressure, reduced pressure and in vacuum. A gas-conduit 19 opens at a top region of the processing tube 10 and extends along the outer wall of the processing tube 10. Another gas-conduit 20 opens at a bottom region of the processing tube 10. In the case of annealing, diffusion and the like, the former conduit 19 and the latter conduit 20 are used to inflow and withdraw gas, respectively. In the case of CVD using reactive gas, and the like, the conduits 19 and 20 are used just opposite to the diffusion.

A processing tube 10 is gas-tightly placed on the supporting plate 21, while the supporting plate 21 is removably and gas-tightly placed on the quartz flange 22. Therefore, when the wafer-holder 24 is lowered, the quartz flange 22 is separated from the processing tube 10. A heat-reflecting plate 23 is rigidly secured on the rear side of the quartz flange 22 so as to prevent heat leakage out of the furnace. The wafer holder 24 is vertically displaced upward and downward in the processing tube 10 by means of the wafer-lifting mechanism 25, such that it (24) is positioned at a level of the upper high temperature furnace 1 or the lower low-temperature furnace 14. When the wafer holder 24 is introduced into or withdrawn out of the processing tube 10, the holder-lifting mechanism 26 is driven.

Although a single wafer 18 is laterally held by the wafer holder 24, two or more wafers can be supported. In addition, a wafer(s) can be vertically held by the wafer-holder 26. Although a single-wall processing tube 10 is shown, a dual-wall processing tube may be used.

The first heat treatment at low temperature and the second heat-treatment at high temperature according to the present invention are illustrated with reference to FIGS. 2 and 3. The second temperature set by the heater 33 of low-temperature furnace 14 is, for example, 700° C., while the first temperature set by the heater of high-temperature furnace 1 is, for example, 1100° C. A shutter 6 is swiveled by 27 beneath the open bottom of the high-temperature furnace 1 and shuts the open bottom, thereby preventing leakage of the radiant heat.

Subsequently, reactant gas or protective gas is caused to flow through the gas conduits 19 and 20. The wafer-holder 24 is then driven to elevate the wafer up to a soaking region of the lower low-temperature furnace 14, and the wafer 18 is subjected to the low-temperature heat treatment at 700° C. as is illustrated in FIG. 2.

After completion of the low-temperature heat treatment, the shutter is swiveled to a position outside the high-temperature furnace 1. Simultaneously, the upper lifting mechanism 2 is driven so as to bring the upper high-temperature furnace 1 into close contact with the lower low-temperature furnace 14. When such position is kept for a certain period of time, the temperature of the upper high-temperature furnace 1 is stabilized at 1100° C., while the temperature of the lower low-temperature furnace 14 rises higher than 700° C. and is stabilized at, for example, 1000° C., i.e. almost a half of 700° C. and 1000° C. The wafer 18 is then immediately moved upward into the soaking region of the upper high-temperature furnace 1 or is maintained in the position as shown in FIGS. 2 and 3, so as to subject the wafer 18 to the high-temperature heat treatment.

Immediately, the upper high-temperature furnace 1 is reverted to the original high level, and the open bottom is shut by the shutter 6. When the temperature of the lower low-temperature furnace 14 is stabilized at 700° C., the wafer stabilized at such temperature 18 is withdrawn out of the processing tube 10.

RTP is attained by the process as described above.

I claim:

1. A method for producing a semiconductor device, comprising the steps of:

electric-resistance heating a first furnace to a first temperature, while essentially preventing leakage of radiant heat outside of said first furnace but allowing leakage of gas heated and expanded by an electric-heater outside said first furnace;

electric-resistance heating a second furnace to a second temperature lower than the first temperature;

subjecting at least one wafer to a first heat treatment in the second furnace which is heated to the second temperature;

after completion of the first heat treatment, directly transmitting the radiant heat of the first furnace in a downward direction into the second furnace which has been heated to the first temperature;

maintaining said at least one wafer in said second furnace until temperature of said second furnace arrives at a temperature almost half of said first temperature and second temperature; and subjecting said at least one wafer to a second heat treatment in said first furnace or said second furnace, while radiant heat of said first furnace is directly transmitted from said first furnace into said second furnace.

* * * * *